United States Patent

Green et al.

Patent Number: 5,863,843
Date of Patent: Jan. 26, 1999

[54] WAFER HOLDER FOR THERMAL PROCESSING APPARATUS

[75] Inventors: Martin Laurence Green, Summit; Thomas Werner Sorsch, Edison, both of N.J.

[73] Assignee: Lucent Technologies Inc., Murray Hill, N.J.

[21] Appl. No.: 692,836

[22] Filed: Jul. 31, 1996

[51] Int. Cl.[6] .................................................. H01L 21/31
[52] U.S. Cl. ...................... 438/771; 438/776; 438/778; 438/788; 438/792; 118/724; 118/728
[58] Field of Search ........................... 437/247; 118/620, 118/725, 728, 729; 438/771, 776, 788, 792

[56] References Cited

U.S. PATENT DOCUMENTS

| | | | |
|---|---|---|---|
| 500,113 | 12/1893 | Wang et al. | 118/723 |
| 4,872,947 | 10/1989 | Wang et al. | 156/643 |
| 5,060,354 | 10/1991 | Chizinsky | 29/25.02 |
| 5,343,938 | 9/1994 | Schmidt | 165/80.2 |
| 5,520,742 | 5/1996 | Ohkase | 118/724 |
| 5,580,388 | 12/1996 | Moore | 118/728 |

*Primary Examiner*—Charles L. Bowers, Jr.
*Assistant Examiner*—Renee R. Berry
*Attorney, Agent, or Firm*—Patricia A. Verlangieri

[57] ABSTRACT

A wafer holder for maintaining a semiconductor wafer at a constant temperature during film deposition is disclosed. The wafer holder is configured to have one or more quartz arms. Affixed to each arm is at least one quartz support, whose top end is adapted for holding the semiconductor wafer. The top end of each support is tapered to have a diameter smaller than that of the quartz support and is optionally tapered to a point. A thermal mass element is optionally supported on the arms of the wafer holder, to keep uniform, the temperature at the perimeter of the wafer with respect to the rest of the semiconductor wafer during a material layer deposition. Also, a quartz backstop is optionally attached to each support arm to keep the semiconductor wafer positioned on top of the quartz supports when the wafer holder is rotated.

9 Claims, 2 Drawing Sheets

WAFER HOLDER FOR THERMAL PROCESSING APPARATUS

BACKGROUND OF THE INVENTION

1. Field of the Invention

The present invention relates generally to the fabrication of semiconductor devices and, more particularly, to an apparatus and method for the rapid thermal processing of semiconductor wafers.

2. Description of the Related Art

The deposition (or growth) of a film such as, for example, a dielectric material, on the surface of a semiconductor wafer is a common step in semiconductor processing. Such depositions (or growths) are usually performed in an apparatus called a deposition reactor, which generally includes a reaction chamber, a wafer holder and handling system, a heat source and temperature control, and a gas delivery system (e.g. inlet, exhaust and flow control). For example, with reference to FIG. 1 there is shown a simplified cross-sectional view of one type of deposition reactor 100, known as a horizontal furnace, in which a susceptor 101 (wafer holder) is positioned in a horizontal tube 102 (usually of circular cross-section), the interior of which is the reaction chamber. The term reaction chamber as used in this disclosure refers to the area within a reactor where the deposition (or growth) of a film on the surface of a semiconductor wafer occurs. Semiconductor wafers 103 are mounted on surface 101a of susceptor 101. Heat source 104 heats the semiconductor wafers 103 and susceptor 101, and reactant gases 105 are introduced into, and flow through horizontal tube 102, past the wafers 103. Susceptor 101 is often tilted so that susceptor surface 101a faces into the flow of reactant gases 105, reducing the depletion of reactant gases in the vicinity of each semiconductor wafer, especially for those semiconductor wafers located the farthest distance away from the input flow of reactant gases 105.

A typical deposition step for a reactor such as, for example, a horizontal furnace, includes the mixing of selected chemical gases in the gas delivery system, which are subsequently introduced into the reaction chamber for deposition as a layer or film of material, onto the surface of a semiconductor wafer. The heat source heats the reaction chamber and accelerates the chemical reaction of the gases in the chamber and also raises the temperature of the semiconductor wafer, to the particular temperature, necessary for film deposition.

Deposition reactors are also classified according to the characteristics of their operation such as, for example, a rapid thermal process (RTP) reactor which is characterized by the amount of time required for heating the semiconductor wafer during a deposition step, as well as the time necessary for cooling the same semiconductor wafer after a film of material has been deposited on it. The term rapid thermal process as used in this disclosure refers to a process having a heat-up rate of at least 20 degrees Centigrade per second and a corresponding cool-down rate of at least 10 degrees Centigrade per second. Conventional furnace reactors generally require on the order of several hours for both the heating up and cooling down steps necessary for depositing a layer of material on a batch of wafers. In contrast, rapid thermal process (RTP) reactors require only between about 5 seconds to 15 minutes for both the heating up and cooling down steps necessary for depositing a layer of material on a wafer, since the heat source used for heating the semiconductor wafers and accelerating the chemical reaction of the gases in such reactors, are high powered lamps. Thus, rapid thermal process (RTP) reactors are characterized in that the process cycle time for depositing a film of material on a semiconductor wafer is considerably shorter than the process cycle time for the same film of material deposited in a conventional furnace reactor.

For most deposition processes, it is desirable to maximize semiconductor wafer throughput (e.g., the number of wafers processed per unit time), while depositing material layers that have uniform thicknesses. To obtain material layers having uniform thicknesses, it is necessary to maintain the semiconductor wafer at a constant temperature, during the film deposition.

A particular problem with rapid thermal process (RTP) reactors is that it is difficult to maintain the semiconductor wafer at a constant temperature while heating with a high powered light source, due to the support mechanism used for holding the semiconductor wafer during the deposition of the material layer. For example, with reference to the furnace reactor of FIG. 1, the semiconductor wafers are typically mounted on the top surface of the susceptor so that the bottom surface of the semiconductor wafer is in full contact with the top surface of the susceptor (side 103b of semiconductor wafer 103 is in full contact with side 101a of susceptor 101). However, in rapid thermal process (RTP) reactors, the process cycle time is only on the order of a few seconds for some heating and cooling cycles, so that if one side of the susceptor is in full contact with one side of the semiconductor wafer, the deposition temperature and cycle time are difficult to achieve. This is because the mass of the susceptor functions as a heatsink and absorbs heat away from the semiconductor wafer, so that the wafer heats to the deposition temperature at a slower rate, increasing the time required to deposit the layer of material on the surface of the wafer. Conversely, the mass of the susceptor also does not dissipate heat quickly, so that the semiconductor wafer cools at a slower rate, increasing the time needed to cool the wafer after deposition. As a result, the susceptor used for holding the semiconductor wafer in most rapid thermal process reactors supports just the outer periphery of the wafer, instead of the entire surface, in order to reduce the time required to deposit a material layer on the surface of the wafer.

FIG. 2A shows a side view of a typical susceptor used in a rapid thermal process reactor, where just the outer periphery of semiconductor wafer 201 is supported with a non-reactive material 202. The term non-reactive material refers to a material which is chemically inactive with all other materials, including reactant gases used in conjunction with the rapid thermal process reactor. FIG. 2B illustrates a top view of the susceptor shown in FIG. 2A. Area 205, whose outline is shown in phantom (with dashed lines), represents that area on the outer periphery of the semiconductor wafer 201 which is supported by the non-reactive material 202. Area 206 represents that area of the semiconductor wafer 201 which is not supported by the non-reactive material 202. The width of the semiconductor wafer 201, supported by the non-reactive material and represented by area 205, is typically on the order of 1 mm (millimeter).

While the use of the susceptor depicted in FIGS. 2A and 2B, reduces the cycle time required for heating and cooling the semiconductor wafer, area 205, supported by the non-reactive material 202, again acts as a heat sink, causing the outer periphery of the semiconductor wafer to have a different surface temperature during the deposition of the film, than area 206 which is not supported. This forms a temperature gradient in the semiconductor wafer and causes the semiconductor wafer to have different deposition rates for the material layer in the center of the wafer than near the perimeter. As a result, films of material deposited on the surface of the semiconductor wafer have areas with different thicknesses. In addition, if the semiconductor wafers have diameters that are larger than about three inches, warping occurs during the heating and cooling cycles, due to the uneven wafer support provided by the non-reactive material. Thus, films deposited on semiconductor wafers using rapid thermal process techniques have proven to be unsatisfactory, since there is a lack of uniformity in the thicknesses of the films deposited on the surfaces of individual wafers, as well as warping of the wafers. Accordingly, rapid thermal process techniques that maintain the semiconductor wafer at a constant temperature during film deposition and which do not warp the wafers, continue to be sought.

SUMMARY OF THE INVENTION

The present invention is directed to a wafer holder (susceptor) for use in conjunction with a rapid thermal processing apparatus. The wafer holder is integrated with but functions independently of the other component parts of the rapid thermal process apparatus, which includes a reaction chamber, a heat source and gas delivery system. The wafer holder keeps constant, the temperature of the semiconductor wafer during film deposition and reduces wafer warping, through decreasing the surface area of the semiconductor wafer in physical contact with the susceptor, using an arrangement of quartz supports. Such an arrangement utilizes a plurality of quartz supports for holding the semiconductor wafer, thus decreasing the temperature gradient of the wafer by reducing the surface area of the semiconductor wafer which is directly supported by the wafer holder.

In one example of the present invention, the wafer holder includes a quartz susceptor configured to have one or more arms. Affixed to each arm is at least one quartz support, for reducing the surface area of the semiconductor wafer in physical contact with the wafer holder. In the present embodiment, the quartz support is depicted as a rod, whose top end protrudes about the same distance above the surface of each of the susceptor arms and is also adapted for holding a semiconductor wafer. It is advantageous for the top end of each support to terminate in approximately the same plane. In this embodiment, the top end of each of the quartz supports is tapered to have a diameter smaller than that of the support, and is optionally tapered to a point.

A thermal mass is optionally supported by the arms of the quartz susceptor, to keep constant, the temperature at the perimeter of the semiconductor wafer with respect to the temperature of the rest of the wafer, during a material layer deposition. In the present embodiment, the thermal mass is depicted as a non-reactive material of uniform composition, shaped to conform to the outer periphery of the semiconductor wafer. The distance between the thermal mass and the semiconductor wafer is made adjustable depending on the length of the quartz supports used for holding the wafer. It is advantageous if the thermal mass is located a uniform distance from the perimeter of the semiconductor wafer. In addition, the quartz susceptor optionally includes an adjustable pedestal for adjusting the vertical positioning of the susceptor relative to the height of the chamber in order to control the rate at which the semiconductor wafer is heated. Also, a quartz backstop is optionally attached to each of the arms to keep the semiconductor wafer positioned on top of the quartz supports when the susceptor is rotated.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

DETAILED DESCRIPTION

Figure 3:
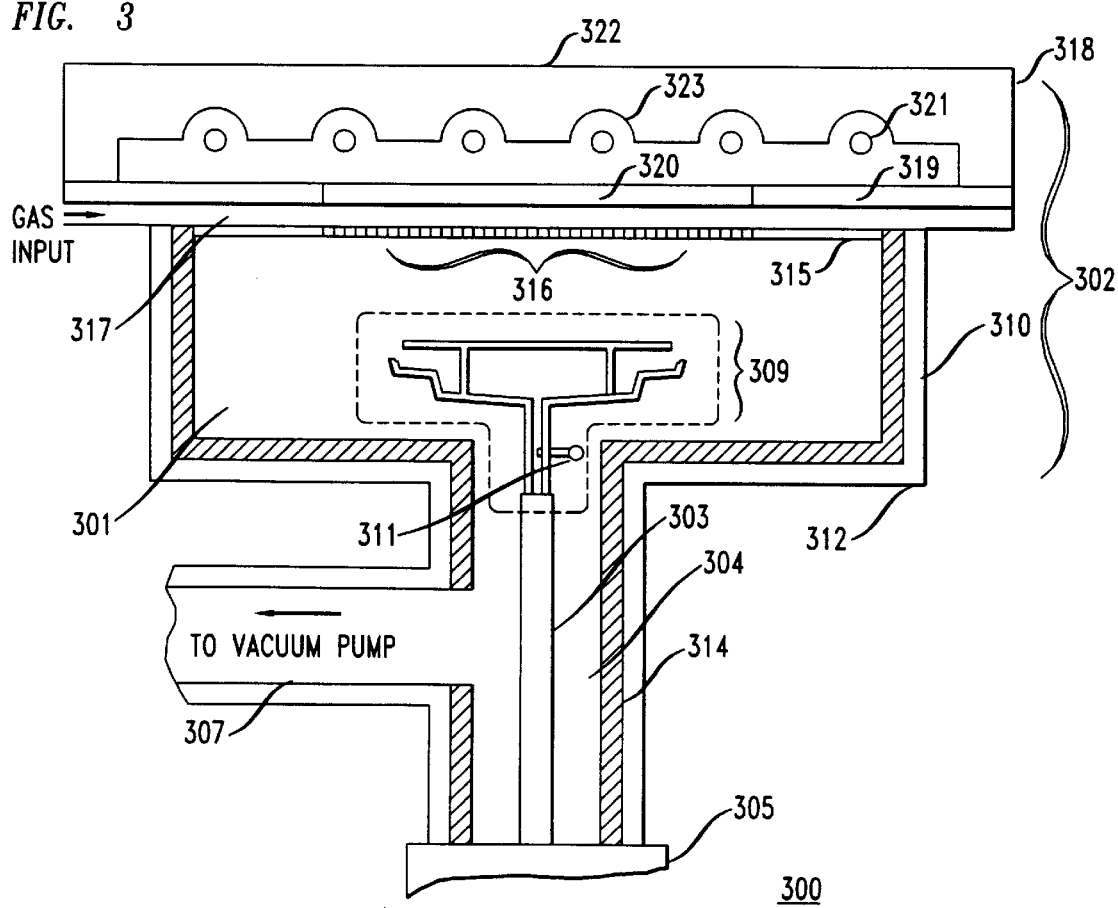
FIG. 3 shows a cross-sectional view of a rapid thermal processing apparatus including the wafer holder of the present invention.

FIG. 3 shows an illustrative application of the present invention wherein a wafer holder (susceptor) is used in conjunction with a deposition reactor, such as, for example rapid thermal processing apparatus 300. Deposition reactors such as rapid thermal processing apparatus 300 are utilized primarily in the electronics industry for depositing or growing material layers on the surface of semiconductor wafers. Examples of material layers which are deposited or grown on the surface of semiconductor wafers include dielectric layers such as silicon dioxide and silicon nitride as well as semiconductor layers such as polysilicon and silicon-germanium.

One embodiment of the present invention is illustrated in FIG. 3, which shows wafer holder 309 (enclosed with dashed lines), located within chamber 301 of rapid thermal processing apparatus 300. Wafer holder 309 is integrated with, but functions independently from, the other component parts of rapid thermal processing apparatus 300. For example, rapid thermal processing apparatus 300 includes additional component parts such as, shaft 303, motor 305, vacuum port 307 and located within chamber 301, heat source 321, quartz shower head 315 and gas input 317. Such component parts will be discussed in conjunction with the following explanation of the operation of rapid thermal processing apparatus 300.

Figure 4:
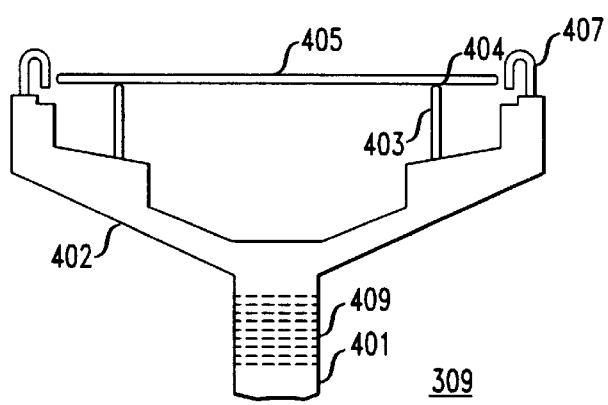
FIG. 4 is a cross-sectional view of the wafer holder of the present invention.
Figure 5:
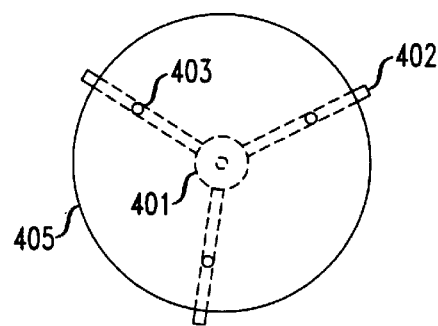
FIG. 5 shows a top view of the wafer holder of FIG. 4.

Wafer holder 309, (susceptor) shown in greater detail in the cross-sectional view of FIG. 4, includes a quartz pedestal 401 to which are attached one or more quartz arms. For illustrative purposes, the wafer holder 309 depicted in FIGS. 4 and 5 includes three quartz arms 402 (not all arms are shown in FIG. 4). Attached to each quartz arm 402 of wafer holder 309 is at least one quartz support 403 whose top end 404 is adapted for holding a semiconductor wafer 405, and which also protrudes above the height of each arm 402, of wafer holder 309. An example of support 403 includes the quartz rod shown in FIG. 4. FIG. 5 depicts a top view of wafer holder 309 showing three quartz arms 402 attached to pedestal 401. Attached to each arm 402 is a support 403. The dashed lines in FIG. 5 depict the structure of wafer holder 309, (shown in phantom) which is located below semiconductor wafer 405.

An objective of the present invention is to maintain the semiconductor wafer at a constant temperature, so that the temperature gradient of the wafer approximates zero, in order to obtain films with uniform thicknesses and reduce warping of the wafer. When the area of the semiconductor wafer that is supported by a susceptor such as, for example, wafer holder 309, is reduced, there is a corresponding reduction of the temperature gradient in the wafer. Thus, the susceptor of the present invention reduces the temperature gradient of the semiconductor wafer by decreasing the area of the wafer which is directly supported by the wafer holder, through the use of quartz supports for holding the wafer, instead of the peripheral support mechanism of FIG. 2 used in the prior art. In addition, the positioning of the quartz supports away from the perimeter of the semiconductor wafer and towards the center of the wafer provides a more even support mechanism across the entire surface of the wafer, preventing wafer warping, which occurs when the semiconductor wafer is only supported at the edges.

The top end 404 of each quartz support protrudes about the same distance above the height of each arm 402 and preferably within the range of 0.5 mm (millimeters) to 60 mm (millimeters) above the top of each quartz arm 402. It is advantageous for the top end of each support to terminate in approximately the same plane. The top end 404 of each quartz support 403, used for holding semiconductor wafer 405, is also tapered to have a diameter less than that of the support. For example, if the diameter of each quartz support is 12 mm (millimeters), than the top end is tapered to have a diameter that is less then 12 mm (millimeters). The top end 404 of each quartz support 403 is preferably tapered to a point.

Figure 6:
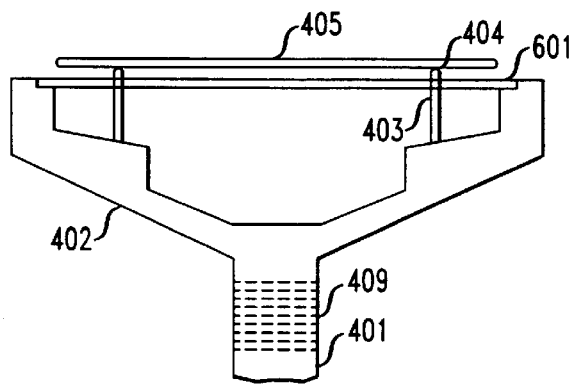
FIG. 6 illustrates a cross-sectional view of the wafer holder of FIG. 4 modified to include a thermal mass for maintaining the perimeter of the semiconductor wafer at a uniform temperature.

In one embodiment of the present invention, the quartz arms 402 optionally support a thermal mass 601, as shown in FIG. 6. Thermal mass 601 functions to keep the wafer temperature at or near the perimeter of the semiconductor wafer uniform, with respect to the temperature of the rest of the wafer during a material layer deposition or growth. The semiconductor wafer 405 is again supported on the quartz supports 403 which protrude a fixed distance above the surface of thermal mass 601, preferably within the range of 0.5 mm (millimeters) to 60 mm (millimeters) above the surface of the thermal mass 601. It is advantageous if thermal mass 601 is located a uniform distance from the perimeter of the semiconductor wafer 405 and not in the semiconductor wafer plane. By radiating heat toward the edge of the semiconductor wafer, thermal mass 601 functions to keep uniform, the temperature at the perimeter of the wafer with respect to the temperature of the rest of the wafer, thus reducing any heat dissipation at or near the edge of the wafer.

Figure 7:
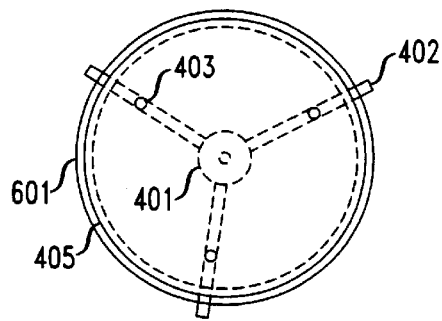
FIG. 7 shows a top view of the wafer holder of FIG. 6.

As illustrated in FIG. 7, thermal mass 601 conforms to the outer periphery of semiconductor wafer 405. Again the dashed lines in FIG. 7 depict the structure of wafer holder 309, (shown in phantom) which is located below the surface of semiconductor wafer 405. The shape of thermal mass 601 is variable and need only conform to the shape of the semiconductor wafer. The width of thermal mass 601 may be as large as 25 mm (millimeters). Thermal mass 601 is typically a non-reactive material, as previously defined, an example of which, silicon carbide, is used as a thermal mass for the growth of a layer of silicon dioxide.

Wafer holder 309 is used in conjunction with a deposition reactor such as, for example, rapid thermal processing apparatus 300. The following explanation discusses the operation of wafer holder 309 with regard to the other component parts of rapid thermal processing apparatus 300 as shown in FIGS. 3 and 4.

It is advantageous for the height of wafer holder 309 to be adjustable relative to the height of chamber 301, in order to control the rate at which the semiconductor wafer is heated. One specific embodiment for adjusting the height of wafer holder 309 is depicted in FIGS. 3 and 4. Wafer holder 309 is attached to shaft 303 with a quartz bar 311 inserted through corresponding passages 409 in the pedestal 401 and the shaft 303 (not shown). The pedestal 401 optionally includes a series of passages 409 located near the base and spaced a fixed distance from each other, that are aligned with corresponding passages in shaft 303 (not shown). The passages 409, represented with dashed lines in FIG. 4, are openings through pedestal 401 which are perpendicular to the vertical axis of the pedestal. Passages 409 are used to adjust the vertical positioning of wafer holder 309 relative to the height of the chamber 301. For example, if each passage 409 on pedestal 401 is spaced 0.5 inches apart, then the wafer holder 309 can be raised or lowered relative to the height of chamber 301, in 0.5 inch increments, by changing which passage is utilized to attach the pedestal 401 to shaft 303.

Shaft 303 extends from pedestal 401 at the top of conduit 304, past vacuum port 307, to motor 305, located at the base of conduit 304. Vacuum port 307 connects conduit 304 and chamber 301 to one or more vacuum pumps (not shown), for reducing the pressure of the chamber and for removing reactant gases from the chamber. Motor 305 is used to rotate susceptor 309 and semiconductor wafer 405, during the deposition or growth of a film on the surface of the wafer. In addition, a quartz backstop 407 is attached to each quartz arm 402, to keep the semiconductor wafer positioned on top of the quartz supports 402, as the susceptor is rotated by motor 305.

Chamber 301, within which wafer holder 309 is attached, includes a cavity 310, having sidewalls 311, and a base 312 opening into the top of conduit 304. Chamber 301 is preferably constructed of a metal such as, for example, steel, which is thick enough to withstand a pressure of at least $10^{-3}$ Torr. The walls of chamber 301 are optionally water cooled (not shown). The sidewalls 311 and base 312, inside of chamber 301, are lined with an insulating material 314 such as, for example, quartz having a matte surface. Quartz with a matte surface has a dull finish and is less penetrable by light. A material such as quartz having a matte surface acts as a thermal insulator to reduce the surface temperature of the sidewalls 311 and base 312.

A clear quartz shower head 315 is attached to cavity 310, near the top of sidewalls 311. The term clear quartz refers to quartz that is penetrable by light. Clear quartz shower head 315 has a plurality of holes 316, inset a fixed distance from sidewalls 311 and corresponding to a location directly above wafer holder 309. The reactant gases are introduced into cavity 310 through holes 316. Gas input area 317 is located directly above clear quartz showerhead 315, where the reactant gases are mixed and injected through holes 316 into cavity 310.

Gas input area 317 is overlaid with a quartz plate 318 which is attached across the top of sidewalls 311. Quartz plate 318 has opaque areas 319 located near sidewalls 311 and a clear area 320 centered above the wafer holder 309, so that the heat generated by heat source 321 is directed toward the location of the semiconductor wafer. Heat source 321 is disposed directly above quartz plate 318 and encased by ceramic shield 322. Examples of heat source 321 include resistive heating elements, and radiant heat sources. The preferred heat source for a rapid thermal process reactor is a radiant heat source such as, for example, a bank of tungsten/halogen lamps. The inner surface of ceramic shield 322 is preferably coated with an inert reflective material 323, such as gold, which can withstand high temperatures and also act as a heat reflector.

A typical deposition process for a reactor such as, for example, rapid thermal processing apparatus 300, includes loading a semiconductor wafer 405 onto wafer holder 309, with a robotic arm (not shown) and evacuating the chamber 301 to a pressure of between 1–90 Torr. Selected gases are input and mixed in gas input area 317 and then injected through holes 316 in quartz shower head 315 into chamber 301, just above semiconductor wafer 405. For example, to grow a layer of silicon dioxide on the surface of a silicon wafer, a gas mixture of argon and oxygen are typically used with flow rates approximating 3750 sccm (standard cubic centimeters) for argon and 370 sccm (standard cubic centimeters) for oxygen. The heat source 321 raises the temperature of the semiconductor wafer 405, to the growth temperature. For example, a growth temperature of 1000 degrees Centigrade useful for growing silicon dioxide, is typically achieved in a time period of 30 seconds, using tungsten/halogen lamps. After the layer of material, silicon dioxide in the above example, has been grown, the lamps are turned off, the chamber cooled and the semiconductor wafer removed from the chamber with the robotic arm (not shown).

Thickness measurements performed for layers of silicon dioxide grown on six inch diameter silicon wafers are shown in Table I and Table II. The measurement results shown in Table I represent a layer of silicon dioxide approximately 40 Å (Angstroms) thick, grown using a susceptor such as, wafer holder 309, in a deposition reactor such as, rapid thermal processing apparatus 300, according to the deposition steps described above. The measurement results shown in Table II represent a layer of silicon dioxide approximately 40 Å (Angstroms) thick, grown using a susceptor such as the prior art peripheral support mechanism of FIG. 2, in a deposition reactor such as, rapid thermal processing apparatus 300, according to the deposition steps described above.

TABLE I

| LAYER 1 FILM | THERMAL oxide | | | |
|---|---|---|---|---|
| SUBSTRATE | Si undoped | | | |
| PARAMETER 1 | Layer 1 Thickness (Å) | | | |
| MEAN | 33.9 | | RANGE | 2.70 |
| MIN | 36.65 | | STD DEV | 0.68 |
| MAX | 39.35 | | % STD DEV | 1.78 |

| Site | X (mm) | Y (mm) | Layer 1 Thickness (Å) |
|---|---|---|---|
| 1 | 0.0000 | 0.0000 | 36.73 |
| 2 | 0.0000 | 23.0000 | 37.51 |
| 3 | −16.2600 | 16.2600 | 37.58 |
| 4 | −23.0000 | 0.0000 | 37.62 |
| 5 | −16.2600 | −16.2600 | 37.76 |
| 6 | 0.0000 | −23.0000 | 37.42 |
| 7 | 16.2600 | −16.2600 | 37.77 |
| 8 | 23.0000 | 0.0000 | 37.77 |
| 9 | 16.2600 | 16.2600 | 37.56 |
| 10 | 0.0000 | 46.0000 | 38.32 |
| 11 | −17.6000 | 42.5000 | 37.93 |
| 12 | −32.5300 | 32.5300 | 38.04 |
| 13 | −42.5000 | 17.6000 | 37.88 |
| 14 | −46.0000 | 0.0000 | 38.37 |
| 15 | −42.5000 | −17.6000 | 37.93 |
| 16 | −32.5300 | −32.5300 | 37.77 |
| 17 | −17.6000 | −42.5000 | 38.01 |
| 18 | 0.0000 | −46.0000 | 39.05 |
| 19 | 17.6000 | −42.5000 | 39.14 |
| 20 | 32.5300 | −32.5300 | 38.87 |
| 21 | 42.5000 | −17.6000 | 38.91 |
| 22 | 42.5000 | 0.000 | 39.28 |
| 23 | 42.5000 | 17.6000 | 38.77 |
| 24 | 32.5300 | 32.5300 | 38.61 |
| 25 | 17.6000 | 42.5000 | 38.44 |
| 26 | 0.0000 | 69.0000 | 38.26 |
| 27 | −17.8600 | 66.6500 | 38.20 |
| 28 | −34.5000 | 59.7600 | 37.94 |
| 29 | −48.7900 | 48.7900 | 37.84 |
| 30 | −59.7600 | 34.5000 | 37.57 |
| 31 | −66.6500 | 17.8600 | 37.55 |
| 32 | −69.0000 | 0.0000 | 37.42 |
| 33 | −66.6500 | −17.8600 | 36.90 |
| 34 | −59.7500 | −34.5000 | 36.65 |
| 35 | −48.7500 | −48.7900 | 36.90 |
| 36 | −34.5000 | −59.7600 | 37.19 |
| 37 | 34.5000 | −59.7600 | 39.35 |
| 38 | 48.7900 | −48.7900 | 38.86 |
| 39 | 59.7600 | −34.5000 | 38.68 |
| 40 | 66.6500 | −17.8600 | 38.70 |
| 41 | 69.0000 | 0.0000 | 39.12 |
| 42 | 66.6500 | 17.8600 | 38.57 |
| 43 | 59.7600 | 34.5000 | 38.50 |
| 44 | 48.7900 | 48.7900 | 38.66 |
| 45 | 34.5000 | 59.7600 | 38.23 |
| 46 | 17.8600 | 66.6500 | 38.20 |

TABLE II

| LAYER 1 FILM | THERMAL oxide | | | |
|---|---|---|---|---|
| SUBSTRATE | Si undoped | | | |
| PARAMETER 1 | Layer 1 Thickness (Å) | | | |
| MEAN | 40.74 | | RANGE | 5.24 |
| MIN | 37.83 | | STD DEV | 1.89 |
| MAX | 43.07 | | % STD DEV | 4.64 |

| Site | X (mm) | Y (mm) | Layer 1 Thickness (Å) |
|---|---|---|---|
| 1 | 0.0000 | 0.0000 | 40.94 |
| 2 | 0.0000 | 23.0000 | 41.85 |
| 3 | −16.2600 | 16.2600 | 42.11 |
| 4 | −23.0000 | 0.0000 | 42.05 |
| 5 | −16.2600 | −16.2600 | 41.93 |
| 6 | 0.0000 | −23.0000 | 42.14 |
| 7 | 16.2600 | −16.2600 | 42.16 |
| 8 | 23.0000 | 0.0000 | 42.46 |
| 9 | 16.2600 | 16.2600 | 42.33 |
| 10 | 0.0000 | 46.0000 | 42.59 |
| 11 | −17.6000 | 42.5000 | 42.52 |
| 12 | −32.5300 | 32.5300 | 42.67 |
| 13 | −42.5000 | 17.6000 | 42.45 |
| 14 | −46.0000 | 0.0000 | 42.49 |
| 15 | −42.5000 | −17.6000 | 42.48 |
| 16 | −32.5300 | −32.5300 | 42.65 |
| 17 | −17.6000 | −42.5000 | 42.82 |
| 18 | 0.0000 | −46.0000 | 42.65 |
| 19 | 17.6000 | −42.5000 | 42.85 |
| 20 | 32.5300 | −32.5300 | 42.64 |
| 21 | 42.5000 | −17.6000 | 42.81 |
| 22 | 42.5000 | 0.000 | 43.07 |
| 23 | 42.5000 | 17.6000 | 42.63 |
| 24 | 32.5300 | 32.5300 | 42.75 |
| 25 | 17.6000 | 42.5000 | 42.67 |
| 26 | 0.0000 | 69.0000 | 38.41 |
| 27 | −17.8600 | 66.6500 | 38.67 |
| 28 | −34.5000 | 59.7600 | 38.88 |
| 29 | −48.7900 | 48.7900 | 39.00 |
| 30 | −59.7600 | 34.5000 | 38.97 |
| 31 | −66.6500 | 17.8600 | 38.56 |
| 32 | −69.0000 | 0.0000 | 39.68 |

TABLE II-continued

| | | | |
|---|---|---|---|
| 33 | −66.6500 | −17.8600 | 38.18 |
| 34 | −59.7500 | −34.5000 | 37.83 |
| 35 | −48.7500 | −48.7900 | 38.11 |
| 36 | −34.5000 | −59.7600 | 38.31 |
| 37 | 34.5000 | −59.7600 | 38.71 |
| 38 | 48.7900 | −48.7900 | 38.42 |
| 39 | 59.7600 | −34.5000 | 38.83 |
| 40 | 66.6500 | −17.8600 | 39.05 |
| 41 | 69.0000 | 0.0000 | 39.25 |
| 42 | 66.6500 | 17.8600 | 39.49 |
| 43 | 59.7600 | 34.5000 | 39.21 |
| 44 | 48.7900 | 48.7900 | 38.94 |
| 45 | 34.5000 | 59.7600 | 38.67 |
| 46 | 17.8600 | 66.6500 | 38.25 |

The six inch silicon wafers were mapped using a Thermawave Opti-Probe Mapping Tool commercially available from Thermawave Company. Forty-six (46) sites on each wafer were selected for measurement of the thickness of the silicon dioxide layers. The center location (site 1) on each silicon wafer was given the x-direction and y-direction coordinates (0, 0). subsequent (sites 2 through 46) are offset fixed distances in millimeters (mm) from the center location. Layer thickness measurements made at each site are reported in angstroms (Å).

The thicknesses of the layer of silicon dioxide (shown in Table I) grown using a susceptor such as wafer holder 309, have a minimum value of 36.65 Å and a maximum value of 39.35 Å, providing a range of values of 2.70 Å across the surface of the six inch diameter silicon wafer and a standard deviation of 0.68 Å.

Figure 1:
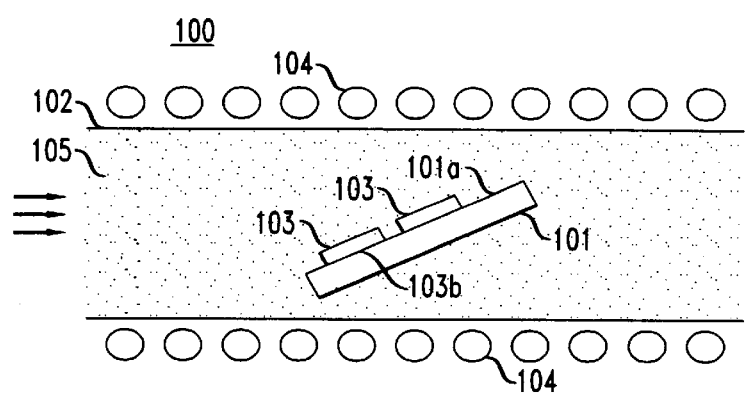
FIG. 1 is a cross-sectional view of a prior art horizontal furnace deposition reactor.
Figure 2A:
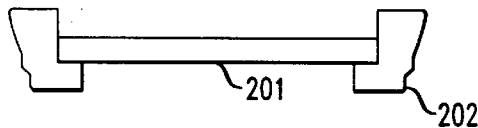
FIG. 2A shows a side view of a prior art rapid thermal process susceptor.
Figure 2B:
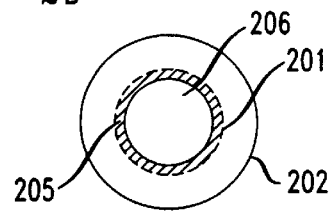
FIG. 2B illustrates a top view of the prior art rapid thermal process susceptor shown in FIG. 2A.

In contrast, the thicknesses of the layer of silicon dioxide (shown in Table II) grown using a susceptor such as the prior art peripheral support mechanism of FIG. 2, have a minimum value of 37.83 Å and a maximum value of 43.07 Å. The peripheral support mechanism of the susceptor of FIG. 2 had a range of values of 5.24 Å across the surface of the six inch diameter silicon wafer, approximately twice the range of values measured for the susceptor of the present invention. Additionally, a standard deviation of 1.89 Å was measured for the support mechanism of FIG. 2, approximately three times greater than the standard deviation measured when the semiconductor wafer was supported by the wafer holder of the present invention.

It should, of course be understood that while the present invention has been described in reference to an illustrative embodiment, other arrangements may be apparent to those of ordinary skill in the art.

The invention claimed is:

1. A method of processing a semiconductor wafer comprising the steps of:

loading a semiconductor wafer into a chamber of a rapid thermal processing system wherein the semiconductor wafer is placed on a quartz susceptor configured to have a plurality of arms, wherein each of the plurality of arms is affixed to a member and has at least one quartz support affixed thereto, wherein a first end of the quartz support terminates in approximately the same plane and is tapered to have a diameter less than the diameter of the quartz supports, and wherein a second end of the quartz support is affixed to the arm;

heating the semiconductor wafer in the chamber wherein the temperature gradient in the semiconductor wafer is controlled by controlling the surface area of the semiconductor wafer in physical contact with the first end of the quartz supports; and removing the semiconductor wafer from the chamber.

2. The method of claim 1, wherein a thermal mass element for heating the perimeter of the semiconductor wafer is supported by the plurality of arms affixed to the quartz susceptor.

3. The method of claim 1, further comprising the step of adjusting the vertical position of the quartz susceptor relative to the height of the chamber.

4. The method of claim 1, wherein a radiant heat source is used to heat the semiconductor wafer.

5. The method of claim 1, wherein the first end of each of the quartz supports is tapered from a first diameter to a second diameter that is smaller than the first diameter.

6. The method of claim 5, wherein the first diameter is tapered to a point.

7. The method of claim 1, wherein the diameter of each quartz support is less than 1 inch.

8. The method of claim 1, wherein the first end of each quartz support protrudes less than 1 inch above the plurality of arms.

9. The method of claim 2, wherein the thermal mass element comprises silicon carbide.

* * * * *